US009601985B2

(12) United States Patent
Kandah et al.

(10) Patent No.: US 9,601,985 B2
(45) Date of Patent: Mar. 21, 2017

(54) SEGMENTED DRIVER FOR A TRANSISTOR DEVICE

(71) Applicant: FREESCALE SEMICONDUCTOR, INC., Austin, TX (US)

(72) Inventors: Ibrahim S. Kandah, Novi, MI (US); Fred T. Brauchler, Canton, MI (US); Steven R. Everson, Gilbert, AZ (US); Kim R. Gauen, Noblesville, IN (US)

(73) Assignee: NXP USA, Inc., Austin, TX (US)

( * ) Notice: Subject to any disclaimer, the term of this patent is extended or adjusted under 35 U.S.C. 154(b) by 342 days.

(21) Appl. No.: 14/266,279

(22) Filed: Apr. 30, 2014

(65) Prior Publication Data

US 2015/0318848 A1 Nov. 5, 2015

(51) Int. Cl.
| | | |
|---|---|---|
| *H02M 7/5383* | (2007.01) | |
| *H02M 1/32* | (2007.01) | |
| *H03K 17/16* | (2006.01) | |
| *H02M 1/08* | (2006.01) | |
| *H02M 7/5387* | (2007.01) | |

(52) U.S. Cl.
CPC .............. *H02M 1/32* (2013.01); *H02M 1/08* (2013.01); *H03K 17/162* (2013.01); *H03K 17/165* (2013.01); *H02M 7/5387* (2013.01)

(58) Field of Classification Search
CPC .......................... H02M 7/5387; H02M 7/5383
USPC ...... 363/40, 41, 49, 55, 56.01, 56.02, 56.04, 363/95, 131–134; 323/282, 315
See application file for complete search history.

(56) References Cited

U.S. PATENT DOCUMENTS

| | | | | | |
|---|---|---|---|---|---|
| 5,977,725 | A | * | 11/1999 | Miyazaki | H02M 7/53803 315/209 R |
| 6,101,106 | A | * | 8/2000 | Shi | H02M 1/38 323/282 |
| 7,319,312 | B2 | * | 1/2008 | Leung | H02M 3/33515 323/283 |
| 7,518,894 | B2 | * | 4/2009 | Fosler | H02J 1/08 363/72 |
| 2003/0161164 | A1 | * | 8/2003 | Shannon | H05B 41/2827 363/40 |
| 2012/0033465 | A1 | * | 2/2012 | Lee | H02M 3/33507 363/53 |
| 2015/0023076 | A1 | * | 1/2015 | Nakamori | H02M 7/48 363/56.03 |
| 2015/0277456 | A1 | * | 10/2015 | Illing | G05F 1/10 323/265 |

* cited by examiner

*Primary Examiner* — Adolf Berhane
*Assistant Examiner* — Nusrat Quddus

(57) ABSTRACT

A segmented driver including at least one drive pin and a sense pin, a driver circuit, a comparator, and a controller. The driver circuit activates a selected drive level between the drive pins and a reference node. The comparator compares a voltage of the sense pin with a threshold voltage and provides a threshold indication when the voltage of the sense pin reaches the threshold voltage. The controller commands the driver circuit to activate a first drive level in response to an off indication, and commands the driver circuit to switch to a second, lower drive level in response to the threshold indication. The driver circuit may be implemented using low resistive current devices. Multiple drive pins may be included, each for selectively activating a corresponding drive path to adjust drive level. The threshold voltage may be set using a current source and resistor, and may be adjusted for temperature.

20 Claims, 4 Drawing Sheets

SEGMENTED DRIVER FOR A TRANSISTOR DEVICE

BACKGROUND OF THE INVENTION

Field of the Invention

The present disclosure relates generally to transistor device driver circuits, and more specifically to a segmented driver that segments driver operation for turning off a transistor device.

Description of the Related Art

High power switching functions (high voltage and/or high current) are used in a variety of applications, such as solar power, uninterruptible power supplies (UPS), motor control, electric vehicles (EV), hybrid EVs (HEV), etc. In the emerging EV/HEV market, for example, inverter circuits are often used to switch a DC input voltage across the phases of a three-phase motor. In most applications, efficiency is paramount in which it is desired to conserve as much energy as possible. In EV/HEV applications, for example, energy efficiency translates to fuel economy and electric range. The inversion process involves high power switching using high voltage electronic transistor switches. An insulated-gate bipolar transistor (IGBT) is particularly advantageous to implement each electronic switch in that it combines high efficiency with fast switching.

In many applications, the switching or inverting function is used to switch large currents between different branches of a high voltage system. Parasitic inductances in the system generate overshoot voltages that may be added to the source voltage during switching. Although it may be desired to switch as quickly as possible, the generated overshoot voltages cause excessive voltages that jeopardize system components including the electronic switches. The excessive voltages may damage or even catastrophically destroy the transistor device and other system components. In order to avoid this undesirable outcome, the voltage rating of the transistor devices may be increased. Alternatively, one or more passive devices may be placed between the control terminal of the transistor switching device and the driver circuit to slow down the switching process to reduce excessive voltage overshoot. For example, a resistor may be inserted between the driver (e.g., gate driver) and the control terminal (e.g., gate) of the transistor device (e.g., IGBT) to slow down switching to reduce voltage overshoot.

Transistor devices with higher voltage ratings may be available, but usually at significantly higher cost. On the other hand, resistors or the like inserted in the control path consume valuable energy during each switching cycle which significantly reduces efficiency. In this manner, a tradeoff often had to be made between selecting transistor devices with higher voltage ratings or adding circuitry that slowed down the switching process.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale.

DETAILED DESCRIPTION

The present inventors have recognized that existing transistor drive systems are less efficient when turning off a transistor device to avoid excessive voltage overshoot. The present inventors have therefore developed a system and method for segmenting the drive operation while turning off a transistor device. A segmented driver as described herein initially activates a high current drive path or otherwise activates multiple drive paths to initially drive the control terminal of the transistor device faster, and then reduces the drive level or turns off at least one current path when a monitored voltage level, such as the collector-to-emitter (VCE) voltage, rises to a threshold level. The transistor device may be driven harder (faster) when the collector voltage is at lower levels, while reducing the drive (slower) when the collector voltage is above levels which can result in excessive overshoot voltages. The allows optimal inverter efficiency during the most common operating points while protecting the transistor device during brief periods of high load. In this manner, the segmented driver optimizes efficiency, avoids excessive overshoot voltage, and allows use of transistor devices with smaller voltage ratings to save cost.

Figure 1:
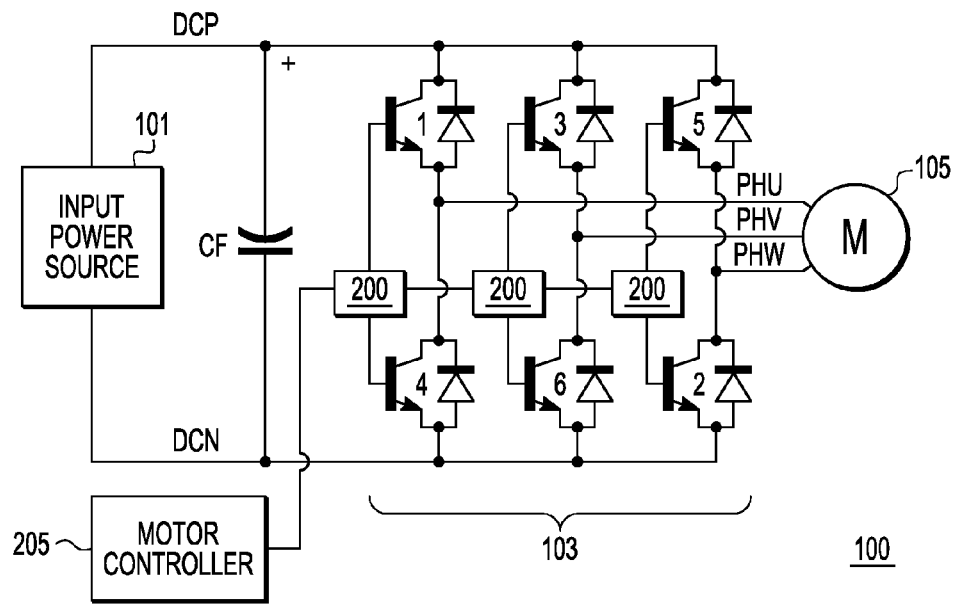
FIG. 1 is a simplified block diagram of a motor drive system that converts energy from an input power source into electronic signals for driving an electric motor.

FIG. 1 is a simplified block diagram of a motor drive system 100 that converts energy from an input power source 101 into electronic signals for driving an electric motor 105. In the illustrated embodiment, the electric motor 105 is a three-phase motor including 3 separate phase inputs. The input power source 101 provides a direct-current (DC) power signal including positive and negative polarities DCP and DCN. A filter capacitor CF is shown coupled between DCP and DCN. An inverter 103 is coupled between DCP and DCN for converting DC power to 3 phase signals PHU, PHV and PHW, in which each phase signal is coupled to a corresponding phase input of the electric motor 105. The input power source 101 may be provided by a suitable DC power source, such as one or more batteries or the like. An electric vehicle, for example, may include a battery configured as a series of lithium-ion battery cells or the like. Alternatively, the input power source 101 may include rectifier circuit (not shown) that converts an alternating-current (AC) source voltage to the DC power signal DCP and DCN.

The inverter 103 includes three separate half-bridges, each for driving one of the corresponding phase signals PHU, PHV and PHW. Each half-bridge includes upper and lower transistor devices having current terminals coupled in series between DCP and DCN forming an intermediate node developing the corresponding phase signal. The upper transistor devices are numbered from left to right as 1, 3 and 5, respectively, and the lower transistor devices are numbered from left to right as 4, 6 and 2, respectively. The transistor devices 1 and 4 are coupled in series with each other to implement a first half-bridge for developing phase signal PHU, the transistor devices 3 and 6 are coupled in series with each other to implement a second half-bridge for developing phase signal PHV, and the transistor devices 5 and 2 are coupled in series with each other to implement a third half-bridge for developing phase signal PHW.

Figure 2:
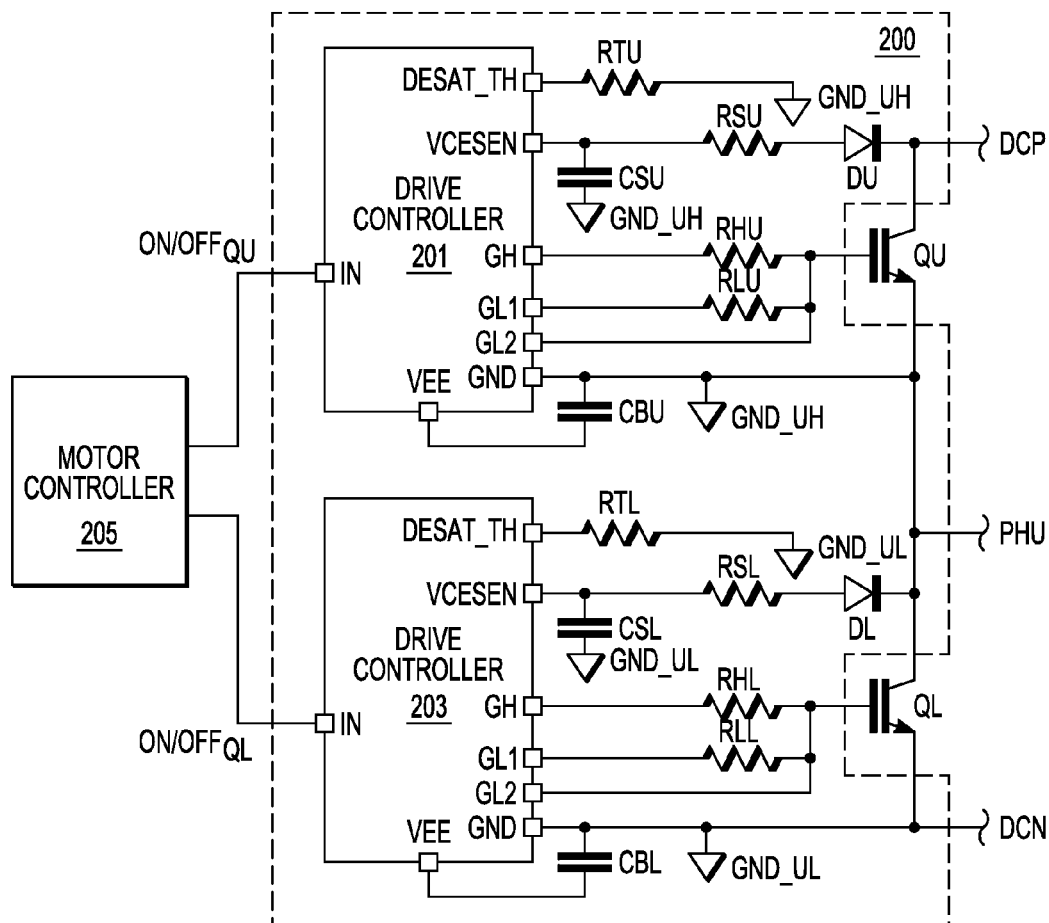
FIG. 2 is schematic and block diagram of the driver circuit controlled by the motor controller of FIG. 1 for controlling switching of a selected half-bridge shown as a pair of transistors QU and QL according to one embodiment.

Each half bridge is controlled by a driver circuit 200 (FIG. 2). As shown, for example, a first driver circuit 200 controls transistor devices 1 and 4, a second driver circuit 200 controls transistor devices 3 and 6, and a third driver circuit 200 controls transistor devices 5 and 2. Each driver circuit 200 is configured in substantially the same manner, but separately controlled by a motor controller 205. Although not explicitly shown, the motor controller 205 may monitor the voltage level between DCP and DCN and the current levels flowing through each of the phases PHU, PHV and PHW of the motor 105. Also, the motor controller 205 may receive external control signals and control switching via each of the driver circuits 200 to control the motor 105, such as motor speed and the like. In one embodiment, for example, the motor controller 205 controls the switching of each half-bridge to simulate a sine wave, in which the half-bridges are separated from each other by 120 degrees according to three-phase motor operation. The frequency and amplitude of the sine waves may be used to control motor speed.

The transistor devices 1-6 may be implemented using any suitable type of electronic switch or transistor, such as any type of bipolar transistor, field-effect transistor, metal-oxide semiconductor (MOS) transistor, etc. The suitability of transistor device selection depends upon several factors or parameters, such as the voltage level between DCP and DCN, the current levels being driven, the desired speed of switching, etc. In one embodiment, the voltage level between DCP and DCN is on the order of one or more hundred Volts (V) (e.g., 200V-300V), and the current levels may be on the order of one or more hundred Amps (A) (e.g., 100 A-600 A). In one embodiment, the speed of the motor 105 may range from several hundred revolutions per minute (RPM) to several thousand RPM. The transistor devices are switched at a much higher rate as the RPM of the motor 105. In one embodiment, for example, the switching frequency is within the range of about 5 kilohertz (kHz) to 10 kHz or more depending upon the configuration. One type of suitable transistor device is the insulated-gate bipolar transistor (IGBT), which is particularly advantageous since it is capable of switching high current levels relatively fast with high efficiency. The transistor devices 1-6 shown in FIG. 1 are depicted as N-channel IGBTs.

As noted above, the transistor devices are switched at a much higher rate than the spin rate of the motor 105 defined by its RPM. Thus, the motor 105 rotates relatively slowly compared to the switching frequency of the transistor devices. The current through the windings of the motor 105 changes relatively slowly as compared to the switching of each individual transistor device. The motor controller 205 controls the transistor switches of the inverter 103 to move the motor current between each of the half-bridges relatively quickly as the motor 105 turns. Although the motor 105 includes physical inductors, the current through the inductors remains relatively constant and may be modeled as a current source during switching. The switching between the half-bridges, however, causes a relatively high change of current (di/dt) in each current path, in which each current path incorporates parasitic inductances. The fast switching causes high current change through the parasitic inductances which generates undesired voltage overshoot. The overshoot voltage adds to the DC power signal developed across DCP/DCN thereby exposing the transistor devices 1-6 to high voltage levels. If switching occurs too quickly, the overshoot voltage increases so that the total voltage may exceed the voltage rating of the transistor devices.

FIG. 2 is schematic and block diagram of the driver circuit 200 controlled by the motor controller 205 for controlling switching of a selected half-bridge shown as a pair of transistors QU and QL according to one embodiment. Transistor QU is the upper transistor and transistor QL is the lower transistor of the transistor device pair of the half-bridge. Each driver controller and half-bridge combination is implemented in similar manner, and each is separately controlled by the motor controller 205 according to three-phase operation. The transistors QU and QL are depicted as N-channel IGBTs, although alternative transistor types and architecture configurations are contemplated. QU has a first current terminal, or collector, coupled to DCP, and a second current terminal, or emitter, coupled to phase signal PHU. QL has a first current terminal, or collector, coupled to phase signal PHU, and a second current terminal, or emitter, coupled to DCN.

The driver circuit 200 includes a pair of drive controllers 201 and 203, each configured in substantially the same manner. Each drive controllers 201 and 203 may be implemented on an integrated circuit (IC) or semiconductor chip or the like for controlling switching operations via external terminals or pins. The upper drive controller 201 is coupled to control switching of the upper transistor QU and the lower drive controller 201 is coupled to control switching of the lower transistor QL. Each drive controller 201 and 203 includes an input pin IN receiving an ON/OFF switch control signal from the motor controller 205 for turning on and off the corresponding transistor device. As shown, the motor controller 205 provides a first switch control signal ON/OFF$_{QU}$ to the input pin IN of the drive controller 201 for controlling switching of transistor QU, and provides a second switch control signal ON/OFF$_{QL}$ to the input pin IN of the drive controller 203 for controlling switching of transistor QL.

The drive controller 201 includes a de-saturation threshold pin DESAT_TH externally coupled to one end of an upper threshold resistor RTU, having its other end coupled to an upper ground GND_UH. The drive controller 201 includes a collector-to-emitter voltage (VCE) sense pin VCESEN, which is externally coupled to one end of an upper filter capacitor CSU and to one end of an upper series resistor RSU. The other end of CSU is coupled to GND_UH, and the other end of RSU is coupled to the anode of an upper sense diode DU. The cathode of DU is coupled to DCP.

The drive controller 201 includes an upper high control pin GH, which is externally coupled to one end of an upper high resistor RHU. The drive controller 201 includes a first upper low control pin GL1, which is externally coupled to one end of an upper low resistor RLU. The other ends of the resistors RHU and RLU are coupled to the control terminal, or gate, of the upper transistor QU. The drive controller 201 further includes a second upper low control pin GL2, which is externally coupled directly to the gate of QU. The drive controller 201 includes a ground pin GND, which is externally coupled to GND_UH and further to phase signal PHU. The drive controller 201 further includes a reference pin VEE, and an upper ground bypass capacitor CBU is externally coupled between the GND and VEE pins.

The drive controller 203 is configured in substantially the same manner and includes the same pins DESAT_TH, VCESEN, GH, GL1, GL2, GND and VEE. The drive controller 203 and its supporting circuitry are, however, coupled to the phase signal PHU and to DCN (which is coupled to a lower ground GND_LU), whereas the drive controller 201 and its supporting circuitry are coupled to DCP and PHU. The external devices are substantially similar and coupled in similar manner, with nomenclature reflecting the low side circuit for controlling switching of QL. In this manner, RTL, CSL, RSL, DL, RHL, RLL, and CBL are similar to and coupled in similar manner as RTU, CSU, RSU, DU, RHU, RLU, and CBU, respectively. The cathode of DL is coupled to PHU, and the GND pin of the drive controller 203 is coupled to DCN. The resistors RHL and RLL are coupled together at the gate of QL.

Operation of the drive circuit 200 is now briefly described. The motor controller 205 asserts the control signals ON/OFF$_{QU}$ and ON/OFF$_{QL}$ to control activation of the transistors QU and QL, respectively. In a half-bridge configuration, only one of the transistors QU and QL is asserted at a time. Thus, the motor controller 205 negates ON/OFF$_{QL}$ to turn off QL and then asserts ON/OFF$_{QU}$ to turn on QU. There is a deadtime delay from when QL is turned off to when QU is turned on to ensure that both are not on at the same time. When the motor controller 205 determines that it is time to turn on QL, if QU is on, it first negates ON/OFF$_{QU}$ to turn off QU, and then asserts ON/OFF$_{QL}$ to turn on QL. Again, there is a deadtime delay from when QU is turned off to when QL is turned on to ensure that both are not on at the same time.

Each ON/OFF signal (ON/OFF$_{QU}$ and ON/OFF$_{QL}$) may be a single digital or binary signal which is active low or high depending upon the particular logic type implemented. Alternatively, each ON/OFF signal may be a differential signal with two input polarity signals (e.g., IN+ and IN−). For a differential configuration, the transistor device may be turned off when IN+ and IN− are asserted to the same logic level, and turned on when IN+ and IN− are asserted to opposite logic levels.

When ON/OFF$_{QU}$ is asserted to turn on QU, the drive controller 201 pulls its GH pin high to turn on QU. Since QL is off, QU turns on and pulls the voltage between DCP and PHU to a relatively low voltage level while current flowing through QU rises to a relatively high current level. The collector-to-emitter (VCE) voltage of QU is monitored by the drive controller 201 via the VCESEN pin relative to the GND pin. The drive controller 201 monitors VCE when QU is on to detect a de-saturation fault, and further monitors VCE when QU is turning off for segmented drive control as further described herein. CSU and RSU are used for filtering high frequency, and RSU limits current from back feeding into the VCESEN pin because of a large change of voltage (large dv/dt) that occurs on the cathode of DU during switching. CSU, along with an internal current source (319, FIG. 3), set a ramp rate to control a de-saturation fault blanking time while QU is turned on. RSU provides a discharge path to keep the voltage at the VCESEN pin low when QU is on and not shorted. When QU is turned on and operating normally (e.g., non-fault condition), the cathode of DU is pulled to the VCE voltage level of QU. The current source 319 charges the capacitor CSU to a voltage just higher than the VCE voltage level of QU. If the voltage of the VCESEN pin rises above a threshold voltage level VTH determined by the drive controller 201, then a de-saturation fault condition is detected to shut down the controller and possibly the entire system.

When ON/OFF$_{QU}$ is negated to turn off QU, the drive controller 201 releases its GH pin and pulls both GL1 and GL2 low to begin the turn off process. As QU is turning off, its gate voltage decreases to a plateau voltage which is a function of the current flowing in the collector of QU. As the gate voltage reaches this plateau level, the collector voltage VCE begins to rise. The rate of rise and level is a function of the current flowing in QU (still unchanged), and the complex capacitance between the gate and collector of QU. Once the gate is discharged just below the plateau level, the current in QU begins to sharply decrease, and the VCE voltage begins to sharply increase towards the DC rail voltage. Due to the parasitic inductances, VCE exceeds the DC rail voltage and then falls back to the DC rail voltage as further illustrated herein.

The drive controller 201 monitors the VCE voltage of QU via the VCESEN pin. When the VCESEN pin reaches the threshold voltage VTH according to segmented drive operation, the drive controller 201 releases GL2 so that only GL1 remains turned on. In this manner, QU is driven harder and faster when the collector voltage is at lower levels, and is driven softer and slower as the collector voltage rises to higher levels. In this manner, QU is switched off faster as compared to that of conventional configurations, and the overshoot voltage is reduced so that the collector voltage does not reach excessive levels. This allows optimized efficiency during the most common operating points while protecting the transistors QU and QL during brief periods of high loads as further described herein. Once QU is turned fully off, GL2 may be re-asserted to keep QU off.

Operation of the drive controller 203 is substantially similar to that of the drive controller 201 for turning on and off transistor QL as controlled by the ON/OFF$_{QL}$ control signal. In the illustrated embodiment, RLU is coupled between the GL1 pin of the controller 201 and the gate of QU, and RLL is coupled between the GL1 pin of the controller 203 and the gate of QL. The resistances of RLU and RLL are set to appropriate levels to limit the current level through the GL1 pin of both controllers to a lower drive level. The current level through the GL2 pin of both controllers is set to a higher driver level. External resistors may be coupled to the GL2 pins; such external resistors, however, are configured with relatively low resistance values (e.g., lower than RLU and RLL) to set the current level to a higher drive level. In one embodiment, for example, the GL2 pin resistors may be 1 Ohm (Ω). In the illustrated embodiment, external resistors are not provided between the GL2 pins of the controllers and the gates of QU and QL.

Figure 3:
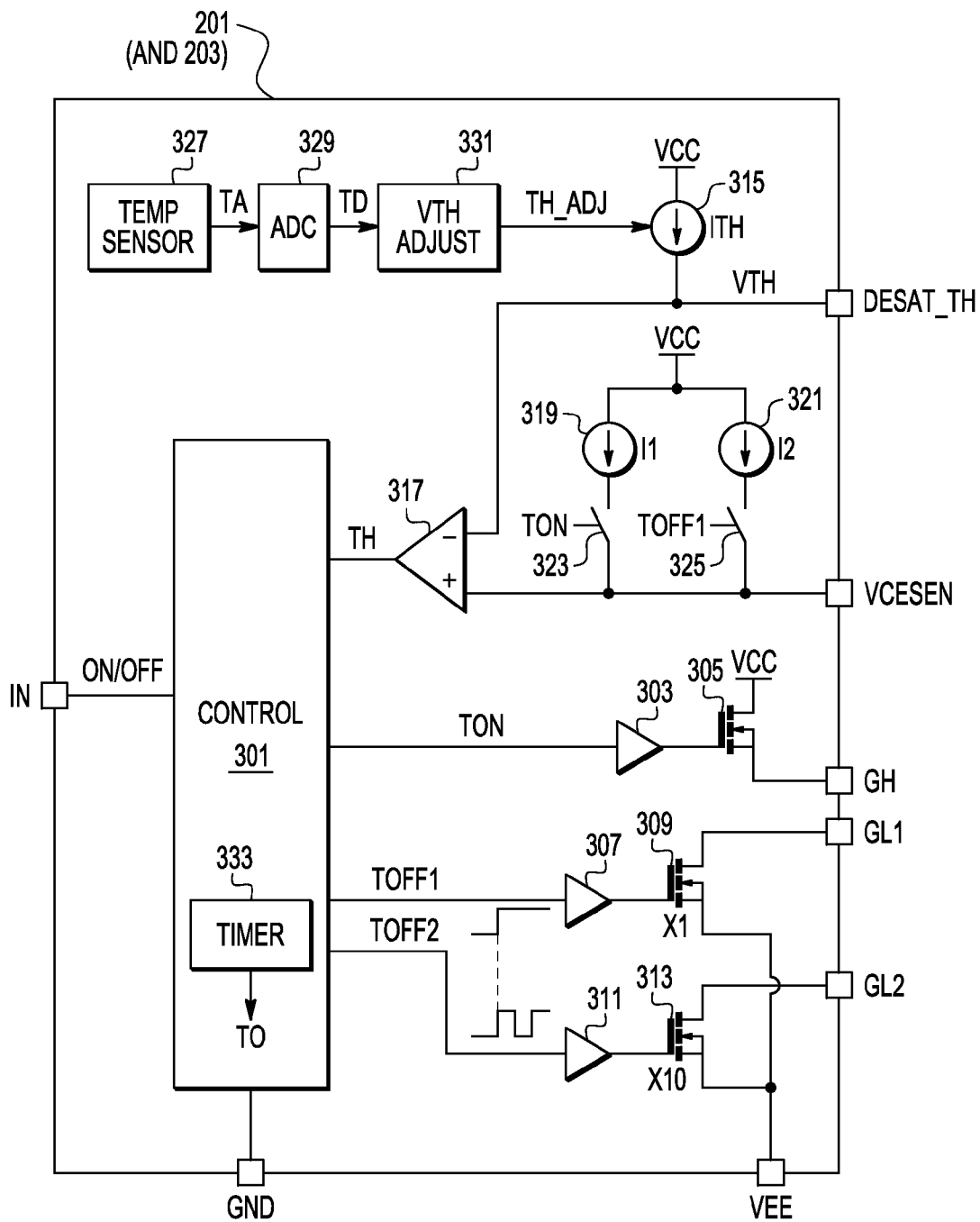
FIG. 3 is a simplified schematic and block diagram of the drive controller of FIG. 2 according to one embodiment.

FIG. 3 is a simplified schematic and block diagram of the drive controller 201 according to one embodiment. The drive controller 203 is configured in substantially the same manner, so that the description of the drive controller 201 equally applies to the drive controller 203. The ON/OFF switch control signal from the motor controller 205 is internally provided to a control block 301 referenced to the GND pin. The control block 301 provides an activation signal TON to an input of a buffer 303, having an output coupled to the gate of a transistor 305. The drain of transistor 305 is coupled to a source voltage VCC, and its source is internally coupled to the GH pin. The drive controller 201 provides a first de-activation signal TOFF1 to an input of a buffer 307, having an output coupled to the gate of a transistor 309. The drain of transistor 309 is coupled to the GL1 pin, and its source is coupled to the VEE pin. The drive controller 201 provides a second de-activation signal TOFF2 to an input of a buffer 311, having an output coupled to the gate of a transistor 313. The drain of transistor 313 is coupled to the GL2 pin, and its source is coupled to the VEE pin. Each of the transistors 305, 309 and 313 are depicted as an N-channel MOSFET, although other polarities and types of drive transistors are contemplated.

An adjustable current source 315 (referenced to VCC) develops a threshold current ITH provided to a node internally coupled to the DESAT_TH pin for developing a threshold voltage VTH. VTH is provided to a negative (or inverting) input of a comparator 317, having an output providing a threshold signal TH or threshold indication to an input of the control block 301. Two additional current sources 319 and 321, both referenced to VCC, develop corresponding currents I1 and I2, respectively. A first single-pole, single-throw (SPST) switch 323 has its switched terminals coupled between an output of the current source 319 and an internal node coupled to the VCESEN pin. The switch 323 is controlled by the TON signal. A second SPST switch 325 has its switched terminals coupled between an output of the current source 321 and the internal node coupled to the VCESEN pin. The switch 323 is controlled by the TOFF1 signal. The VCESEN pin is further coupled to the positive (or non-inverting) input of the comparator 317.

The drive controller 201 may further include a temperature sensor 327 providing an analog temperature signal TA to an input of an analog to digital converter (ADC) 329. The ADC 329 converts TA to a digital temperature signal TD, which is provided to an input of a threshold adjust circuit 331. The threshold adjust circuit 331 provides a threshold adjust signal TH_ADJ to a control input of the current source 315. The control block 301 is further shown with a timer 333 that provides a timeout signal TO.

Operation of the drive controller 201 is now briefly described. When the ON/OFF signal indicates to turn on QU, the control block 301 asserts TON high to turn on transistor 305. Transistor 305 pulls the GH pin high to turn QU on. The switch 323 is closed so that the current source 319 sources the current I1 via the VCESEN pin to charge the capacitor CSU for de-saturation fault detection as previously described. The current source 315 sources the threshold current ITH to the resistor RTU via the DESAT_TH pin to establish the voltage level of VTH. The comparator 317 compares VTH with the voltage level that develops on VCESEN (representing the VCE voltage of QU) while QU is on. If the voltage of VCESEN reaches VTH while QU is on, a fault condition is detected and the comparator 317 switches.

When the ON/OFF signal indicates to turn off QU, the control block 301 negates TON to turn off transistor 305, and asserts the TOFF1 and TOFF2 signals to turn on both transistors 309 and 313. The transistor 309 has a notation "X1" and the transistor 313 has a notation "X10." In the specific configuration, the transistor 313 is 10 times larger or otherwise represents 10 of the same-sized transistors as transistor 309 coupled in parallel. In this manner, the transistor 313 has a substantially smaller on-resistance as compared to the transistor 309. The factor of "10" is arbitrary and different size ratios may be employed. It is further noted that since the pin GL2 may be coupled directly to the gate of QU, the transistor 313 provides a direct and low resistive path to the reference pin VEE when turned on. Since TOFF1 also turns transistor 309 on, another current path via resistor RLL and transistor 309 is activated to turn QU off. In this manner, QU is initially driven relatively fast and hard to begin turn off operation.

The VEE pin serves as a reference node for the turn off transistors 309 and 313. Although the reference node is provided as an input/output (I/O) pin of the drive controller, it may alternatively be an internal node. It is noted that the VEE pin may be pulled to a negative voltage level relative to the GND pin by an external source (not shown). In this manner, when the opposite transistor device of the half-bridge, such as the lower transistor QL in the illustrated configuration, is turned on, the negative bias of the VEE pin prevents QU from momentarily turning on and having shoot through current. The bypass capacitor CBU helps to prevent VEE from deviating significantly during switching. In one embodiment, VEE is pulled below ground by several Volts, such as between −5V to −15V or so depending upon the particular configuration. The buffers 307 and 311 may include level shifters or the like, or the level shifters may be separately included, for switching the transistors 309 and 313 relative to the voltage of the VEE pin.

The TOFF1 signal also closes switch 325 so that the current source 321 provides the current I2 to the VCESEN pin for charging capacitor CSU. The charging of the capacitor CSU using the current source I1 while QU is turned on is configured according to a particular blanking period for detecting the de-saturation fault as previously described. The charging of the capacitor CSU using the current source I2 while QU is turning off is configured to sense when the VCE voltage of QU reaches the threshold. It is desired to reduce voltage sensing delay for more quickly determining the voltage level of VCE while QU is turning off. In this manner, I2 is greater than I1 so that the VCESEN pin tracks changes of VCE more closely to reduce timing delay. In this manner, the determination of when VCE reaches the threshold voltage VTH is more accurately, or at least more quickly, determined.

When the voltage of the VCESEN pin reaches VTH (indicating that the VCE voltage of QU has reached VTH), the comparator 317 switches providing the threshold indication TH to the control block 301. In response to TH changing state, the control block 301 negates TOFF2 while TOFF1 remains asserted, so that transistor 313 is turned off while transistor 309 remains on. In this manner, the lower resistance, higher current path to the reference pin VEE is turned off leaving the higher resistance, lower current path turned on. The threshold voltage VTH is set at a voltage level just before the VCE voltage of QU begins rising quickly during switching as further described herein. Thus, when the VCE voltage of QU begins quickly rising as QU is turned off, it is turned off using only the higher resistance, lower current path through resistor RLU and transistor 309. The result is that the overshoot voltage of VCE is substantially reduced thereby avoiding excessive voltage across the transistors QU and QL.

It is noted that a conventional configuration turns off the transistor solely via a resistor or the like thereby slowing down the switching process. Although this reduces the voltage overshoot, switching is slower for the entire operating range of the inverter. In the segmented drive configuration, much of the initial current to discharge the gate capacitance of the transistor QU flows through the lower resistance, higher current path via the transistor 313. Before the collector voltage of QU substantially increases, however, as detected using the de-saturation detection circuitry including the comparator 317, the higher current path is turned off. In this manner, switching is faster, particularly when the transistor current is at lower levels, which are more common in most applications.

After QU is turned fully off, the control block 301 re-asserts TOFF2 to keep QU turned fully off for the remainder of the cycle before it is turned back on in the next cycle. It may be possible to detect when QU is turned fully off for determining timing for re-asserting TOFF2. In the illustrated embodiment, the timer 333 establishes a predetermined time period that is initiated when both TOFF1 and TOFF2 are initially asserted to begin turning off QU. Upon timeout of the timer 333 indicating that QU is turned fully off, the timer 333 asserts TO and the control block 301 re-asserts TOFF2 in response to TO. The timeout period of the timer 333 may be empirically determined or may otherwise be set or otherwise programmed at a time period in which it is assured that QU is turned fully off.

The timing of the detection of when VCE reaches and then exceeds VTH to trigger assertion of TH may change with temperature conditions. The threshold adjust circuit 331 detects the temperature via the temperature signal TD and adjusts TH_ADJ at its output to adjust ITH and thus VTH. Such adjustment may be made in a relatively continuous manner, in which each change of temperature causes a corresponding change of TH_ADJ. It is noted, however, that the operative temperature range may be relatively wide (e.g., −40° C. to +150° C.), whereas the corresponding range of TH_ADJ to compensate for temperature change is relatively small by comparison. For example, ITH may have a nominal magnitude of about one or two hundred microamperes (µA) (e.g., about 150 µA) at room temperature (e.g., about 20° C.), it may be adjusted by only a few µA when the temperature reaches an extreme.

In one embodiment using IGBTs as the transistor devices, ITH remains at its nominal magnitude for most of the temperature range. When the temperature falls below a predetermined cold temperature threshold, such as 0° C., the breakdown voltage of the IGBT is reduced whereas its corresponding switching speed is increased. In this manner, when the temperature falls below the cold temperature threshold, TH_ADJ is reduced to reduce ITH to thus to reduce VTH. Although this effectively slows down the switching event, the reduction of VTH serves to protect the IGBTs from excessive voltages. Further, the system should heat up and rise above the cold temperature threshold relatively quickly, so that VTH is switched back to its nominal operating range to speed up the switching event to obtain the desired benefits.

The temperature monitoring and VTH adjustment is very flexible and may be modified for different electronic switches or different transistor devices types to compensate for different operating conditions at selected temperature thresholds.

Operation of the drive controller 203 for controlling turn on and turn off of the transistor QL in response to the ON/OFFQL signal from the motor controller 205 is substantially the same. In either case, the transistor 313 provides a higher drive level by coupling a lower on-resistance path to a reference node to drive a significant level of current for turning off the external transistor device. The transistor 309 provides a lower drive level by coupling a higher on-resistance path to the reference node to drive a lesser amount of current for turning off the transistor. Both transistors are turned on to apply a high drive level, and then transistor 313 is turned off in response to the threshold indication to reduce the drive level to complete the turn off process.

In alternative configurations, additional drive paths may be included to adjust drive level for each pin or each driver may be programmable or adjustable. Both drive paths may be coupled to the same external drive pin. The use of two drive pins, however, enables adjustment for each path with external resistors for greater flexibility for users of the drive controller. The segmented driver may further be tuned to optimize the turn off switching event by inserting a small delay from assertion of TH by the comparator 317 to deactivation of the transistor 313. Such delay may be implemented within the control block 301 and/or by adjusting the delay of the buffer. In certain embodiments, such delay may be 30 to 50 nanoseconds (ns) and it typically less than 100 ns. Alternatively, VTH may be configured to be adjustable based on the state of the power transistor (e.g., QL or QU). In this alternative case, when the power transistor is turned on, a first level of VTH is used to protect against the normal ON state faults, such as a short to GND or DCP or the like. The level of VTH is the changed to a different threshold level for turning the power transistor for segmented drive operation. A lower VTH threshold may be desired during the ON state for protection of the power transistor against abnormally high current, whereas a higher threshold may be desired at turn off to improve (e.g., reduce) turn off energy loss (EOFF).

Figure 4:
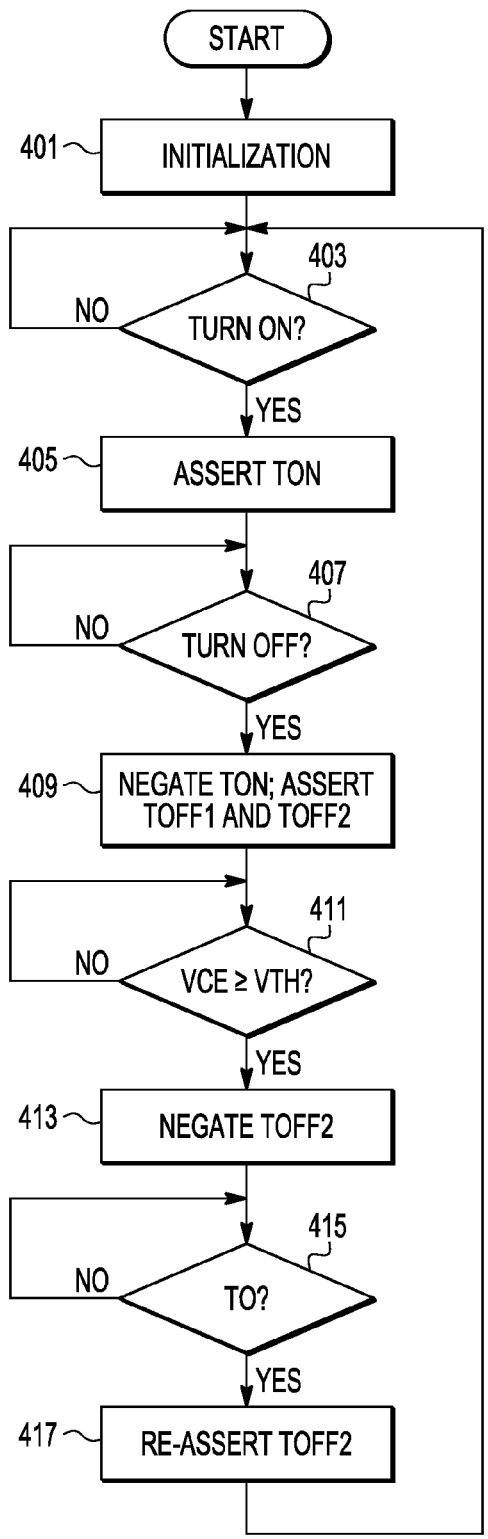
FIG. 4 is a timing diagram illustrating operation of the control block of FIG. 3 for controlling operation of a segmented driver according to one embodiment.

FIG. 4 is a timing diagram illustrating operation of the control block 301 for controlling operation of a segmented driver according to one embodiment. The illustrated operation is simplified and does not include many of the more specific details that are not necessary for a full and complete understanding of the disclosed embodiments. Upon power up or reset (POR), the drive controller 201 may perform initialization as shown at block 401, in which initialization may include setting initial parameters and operating conditions. Upon POR, the TOFF1 and TOFF2 signals may initially be asserted high to turn off an external transistor device (e.g, QU). Operation advances to next block 403, in which it is queried whether the ON/OFF signal indicates to turn on the transistor. Operation loops at block 403 until the ON/OFF signal indicates to turn on the transistor.

When the ON/OFF signal indicates to turn on the transistor, operation advances to block 405 in which the control block asserts TON to turn on the transistor. The transistor 305 is turned on to pull the control terminal of the external transistor high. Also, the switch 323 is closed to apply current I1 to the VCESEN pin for de-saturation fault detection. Fault detection and operation are not further described as not necessary for a full and complete understanding of the illustrated embodiments. After TON is asserted, operation advances to next block 407 in which it is queried whether the ON/OFF signal indicates to turn off the transistor. Operation loops at block 407 until the ON/OFF signal indicates to turn off the transistor.

When the ON/OFF signal indicates to turn off the transistor, operation advances to block 409 in which the control block negates TON (or otherwise asserts it low) and asserts both TOFF1 and TOFF2 to begin turning off the transistor. TON turns off transistor 305 so that the control terminal of the external transistor is no longer pulled high. Also, the switch 323 is opened to decouple current I1 from the VCESEN pin (used for de-saturation fault detect). TOFF1 and TOFF2 activate both transistors 309 and 313 so that both the higher resistance and lower resistance current paths to the reference node VEE to pull significant current from the control terminal of the external transistor and thus to begin strongly turning it off. TOFF1 also closes switch 325 so that current I2 is applied to the VCESEN pin. The current I2 is used to reduce delay for faster detection of the VCE voltage of the external transistor.

After TOFF1 and TOFF2 are asserted, operation advances to block 411 to query whether VCE is greater than or equal to VTH (e.g., VCE≥VTH?). As previously described, the current source 315 applies current ITH to the DESAT_TH pin into external threshold resistor RTU to establish the voltage level of VTH. RTU may be selected to adjust VTH as desired. The VCE voltage of the external transistor is monitored via the VCESEN pin, and the comparator 317 asserts the threshold indication when VCE reaches VTH.

When TH is asserted indicating that VCE≥VTH as determined at block 411, operation advances to block 413 in which the control block 301 negates TOFF2 according to segmented driver operation. Thus, the transistor 313 is turned off while the transistor 309 remains turned on to complete the turn off process. Operation then advances to block 415 in which the control block 301 monitors the TO signal from the timer 333. As previously described, TO is asserted when it is assured that the external transistor has turned fully off.

Upon assertion of TO as determined at block 415, operation advances to block 417 in which the control block 301 re-asserts TOFF2. Re-asserting TOFF2 after the external transistor has fully turned off does not affect dynamic operation but simply ensures that it remains fully turned off with low impedance on the control terminal during the remainder of the cycle. Operation then advances back to block 403 in which it is once again queried whether the ON/OFF signal indicates to turn on the transistor. Operation repeats in this manner during normal operation.

When the system is under higher load conditions (e.g., such as an electric vehicle accelerating or climbing a hill), the current through the activated transistor of each half-bridge is higher and the VCE of the activated transistor rises more quickly when the turn off processes is initiated (i.e., when both transistors 309 and 313 are turned on). In this manner, the threshold condition detected by the comparator 317 occurs sooner in the process and serves to cap the overshoot voltage at a reasonable level. When the system is under lower load conditions (e.g., such as an electric vehicle cruising at a steady rate or going downhill), the current through the activated transistor of each half-bridge is lower and the VCE of the activated transistor does not rise as quickly when the turn off processes is initiated. In the lower load case, the threshold condition occurs later in the process and may not actually occur in time since VCE may already be starting to shoot to the higher voltage levels. This is inconsequential, however, since at lower current conditions, the overshoot voltage is not excessive so that all of the benefits of driving the transistor devices harder earlier in the turn off process are achieved.

The "sustain" current applied to complete the turn off process of the transistors QU and QL is determined by the resistance of the resistors RLU and RLL and the on-resistance of the transistor 309. The use of an external resistor enables adjustment of the sustain current. In conventional configurations, external current limiting devices were needed to slow down the turn off process under all operating conditions, including low to high load conditions. The external current limiting devices may be resistors or Zener diodes or the like. An external resistor in the conventional configuration had to prevent overshoot voltage under all load conditions and thus had to be sufficiently high to slow down switching. In many such conventional configurations, the resistor had a higher resistance, such as 10-20 Ohms ($\Omega$) or the like. In a segmented driver configuration as described herein, the resistance of the resistors RLU and RLL may be set similarly to a conventional configuration, but GL2, the larger driver, may be either directly coupled to the transistor gate or thru a substantially smaller resistor to further improve efficiency.

Figure 5:
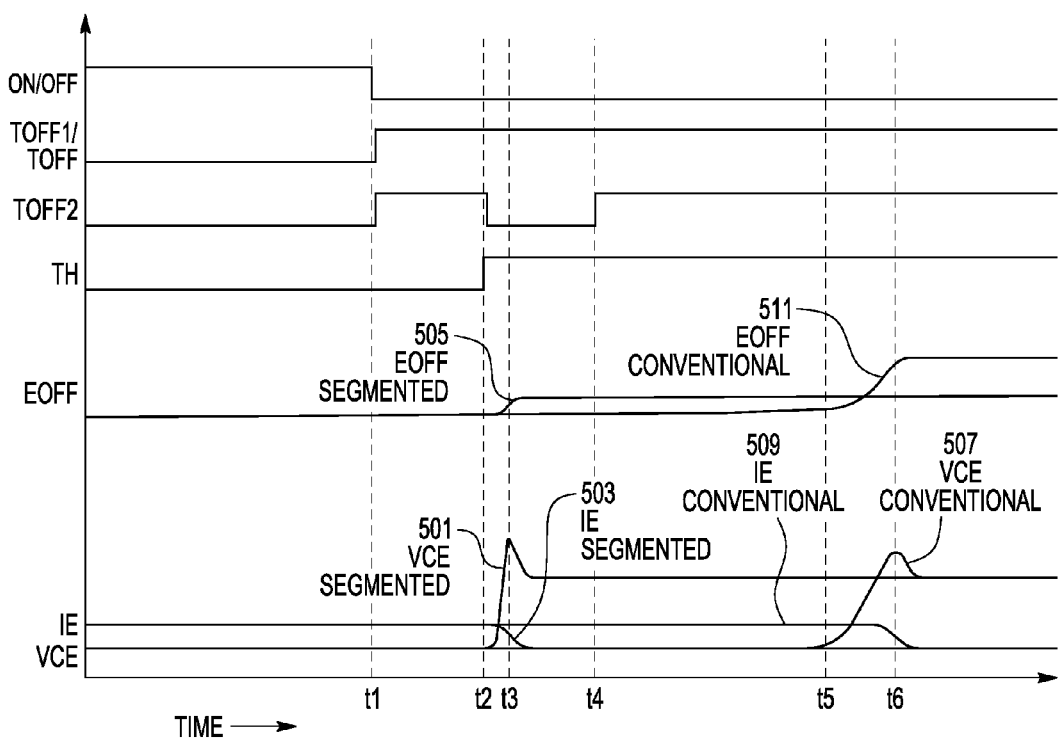
FIG. 5 is a graphic diagram plotting exemplary signals versus time for a turn off event for both a segmented driver implemented according to an exemplary embodiment and a conventional driver.

FIG. 5 is a graphic diagram plotting signals ON/OFF, TOFF1/TOFF, TOFF2, TH, EOFF IE and VCE versus time for a turn off event for both a segmented driver implemented according to an exemplary embodiment and a conventional driver. Signal ON/OFF is a control signal from a central controller (e.g., motor controller 205). The segmented driver uses control signals TOFF1 and TOFF2 to turn off its corresponding transistor, whereas the conventional driver uses a single turn off signal TOFF. TOFF1 and TOFF are shown as the same control signal since their timing is substantially similar. The signal EOFF is the turn off energy loss plotted for both the segmented driver and the conventional driver. For each transistor, IE is the corresponding emitter current and VCE is the corresponding collector-to-emitter voltage. As shown in FIG. 5, VCE, IE and EOFF for the segmented driver are shown by curves 501, 503 and 505, respectively, and VCE, IE and EOFF for the conventional driver are shown by curves 507, 509 and 511, respectively.

The segmented driver is configured with a driver controller substantially similar to the drive controller 201 as shown in FIGS. 2 and 3, except that a small 1$\Omega$ resistor is placed between the control terminal of the corresponding transistor and controller pin GL2. The conventional driver configuration uses a 15$\Omega$ resistor placed between the control terminal of the corresponding transistor and a single low gate control pin (e.g., GL, not shown) of the conventional driver. The resistor coupled to pin GL2 of the segmented driver (e.g., RHU) may also be about 15$\Omega$, although any suitable resistance is contemplated. In the particular illustration shown in FIG. 5, the DC voltage of DCP is about 300V, and the emitter current IE through the transistors for both cases is about 100 Amperes (A) when turned on.

The transistors are initially turned on before a time t1, in which the emitter current IE is about the same (100 A) for both cases. Since both transistors are turned on, VCE is relatively small for both cases. At about time t1, the central controller asserts ON/OFF low to command the drive controllers to turn off the transistors. Very soon after time t1, the signal TOFF for the conventional driver and the signals TOFF1 and TOFF2 for the segmented driver are asserted high. Although not shown, the signal turning on each transistor (e.g., TON) has been pulled low or otherwise de-asserted.

Although not explicitly shown, from time t1 to a subsequent time t2, the gate voltages (VGE) of both transistors begin to discharge and the collector voltages VCE begin to increase relatively slowly. Because of the additional high current discharge path through the GL2 pin of the segmented driver, however, VGE discharges more quickly and VCE begins to rise more quickly for the segmented driver. At time t2, VCE for the segmented driver reaches the threshold voltage VTH and the threshold signal TH is asserted. Shortly after TH is asserted, the segmented driver negates TOFF2 low so that the high current path through pin GL2 is turned off.

Although the high current path of the segmented driver has been turned off, the VGE of the transistor being driven by the segmented driver has already been almost completely discharged just after time t2. As shown by curve 501, VCE for the segmented driver case rises rapidly just after t2 and reaches a peak voltage level about a time t3. As VCE for the transistor being driven by the segmented drive is increasing, its emitter current IE decreases as shown by curve 503. The turn off energy EOFF for the segmented drive rises to a relatively modest level just after time t3. At subsequent time t4 after VCE has stabilized at the DC voltage level, the segmented driver re-asserts TOFF2 to re-activate the high current path to effectively clamp the transistor off.

After the transistor driven by the segmented driver has turned completely off, such as at about time t4, VGE for the transistor by the conventional driver is still discharging so that IE is still high as shown by curve 509 and VCE is still slowly rising. At subsequent time t5, VCE for the transistor of the conventional case finally rises and reaches a peak voltage level at about time t6 as shown by curve 507. At about this time, IE for the transistor for the conventional case decreases as shown by curve 509. EOFF for the conventional case rises to a relatively high level as shown by curve 511, in which the turn off energy for the conventional driver case is more than twice that of the segmented driver case.

In summary, just after time t2, the conventional driver and the segmented driver are both discharging through a resistor (e.g., the 15Ω resistor for the conventional case, and RHU for the segmented gate driver). At this time, VGE of the transistor being driven by the segmented driver has already been almost completely discharged by the high current path, whereas VGE of the transistor being driven by the conventional driver still has a significant amount of charge. Thus, the transistor driven by the segmented driver is ready to switch or is already switching, whereas the transistor driven by the conventional driver is still discharging. Furthermore, since the high current discharge path for the segmented driver has been turned off just prior to switching of the corresponding transistor, the peak voltage level of VCE is not excessive and is about the same as that for the conventional case.

Figure 6:
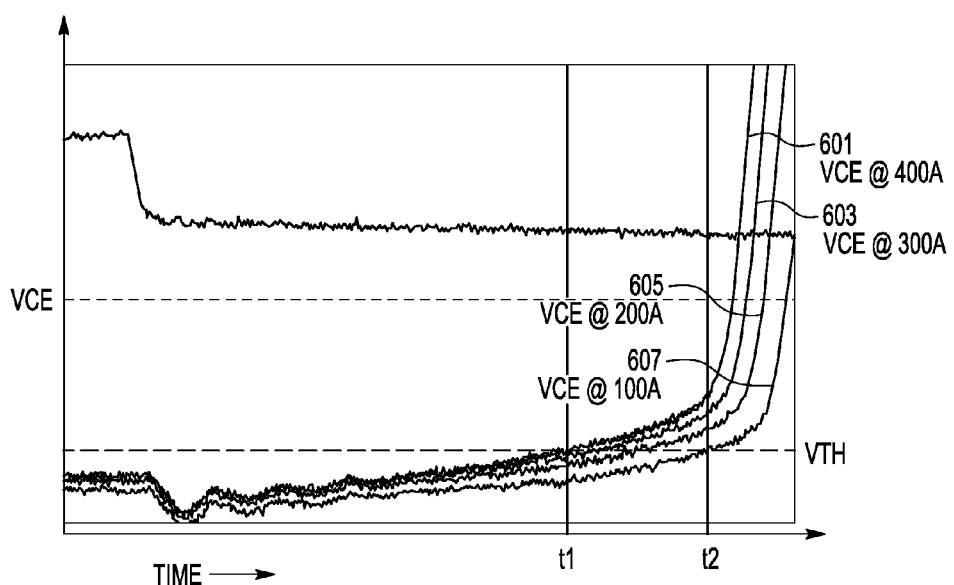
FIG. 6 is a graphic diagram plotting VCE for a segmented driver implemented according to an exemplary embodiment for four different transistor current levels IE representing switching the transistor off during four different load levels.

FIG. 6 is a graphic diagram plotting VCE for a segmented driver implemented according to an exemplary embodiment for four different transistor current levels IE representing switching the transistor off during four different load levels. As shown in FIG. 6, VCE for an IE current level of 400 A (high load level) is shown by curve 601, VCE for an IE current level of 300 A is shown by curve 603, VCE for an IE current level of 200 A is shown by curve 605, and VCE for an IE current level of 100 A (low load level) is shown by curve 607. A horizontal plot is shown for the threshold voltage level VTH.

FIG. 6 illustrates that VCE increases more rapidly during higher current (load) levels. As a consequence, during a high load level VCE reaches VTH more quickly such as shown by curve 601 crossing VTH at about a time t1. Nonetheless, the "knee" of curve 601 when VCE rapidly rises does not occur until after a time t2 so that the higher current path is turned off in time to avoid excessive VCE overshoot. On the other hand, during a low load level VCE does not reach VTH until later as shown by curve 607 crossing VTH at about time t2. Relatively soon after time t2, curve 607 rapidly rises. If the threshold voltage event were to occur later in time for the high current case (curve 601) as it does for the low current case (curve 607), then the high current path may not be turned off sufficiently soon to avoid excessive VCE overshoot voltage. This is inconsequential, however, in the low current case since even though the turn off event occurs later and closer to the knee for the low current case, excessive VCE overshoot does not occur. This is a desirable trait since full drive at lower current levels is advantageous whereas reduced drive at higher current levels is still achieved.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims. For example, variations of positive logic or negative logic may be used in various embodiments in which the present invention is not limited to specific logic polarities, device types or voltage levels or the like. Also, although the present invention is illustrated in the context of a three-phase motor driver application, it is equally applicable to other applications for switching transistor devices in high voltage and/or high current environments, such as solar power applications, UPS applications, EV/HEV applications, etc.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A segmented driver, comprising:
   at least one drive pin and a sense pin;
   a driver circuit that is configured to activate a selected drive level between said at least one drive pin and a reference node;
   a comparator that is configured to compare a voltage of said sense pin with a threshold voltage and to provide a threshold indication when said voltage of said sense pin reaches said threshold voltage; and
   a controller that is configured to command said driver circuit to activate a first drive level in response to an off indication, and to command said driver circuit to switch from said first drive level to a second drive level that is lower than said first drive level in response to said threshold indication.

2. The segmented driver of claim 1, wherein said at least one drive pin comprises a first drive pin and a second drive pin, wherein said driver circuit is configured to apply said first drive level by coupling a first resistive path between said first drive pin and said reference node and by coupling a second resistive path between said second drive pin and said reference node, and wherein said driver circuit is configured to apply said second drive level by de-coupling said second resistive path from said second drive pin.

3. The segmented driver of claim 1, further comprising:
   a first current device and a second current device each coupled between said at least one drive pin and said reference node; and
   wherein said driver circuit activates both said first current device and said second current device to apply said first drive level, and wherein said driver circuit activates only one of said first current device and said second current device to apply said second drive level.

4. The segmented driver of claim 3, wherein said first and second current devices each comprise an N-type field-effect transistor having a drain terminal coupled to said at least one drive pin and a source coupled to said reference node.

5. The segmented driver of claim 1, wherein said at least one drive terminal comprises a first drive pin and a second drive pin, and wherein said segmented driver further comprises:
   a first current device coupled between said first drive pin and said reference node;

a second current device coupled between said second drive pin and said reference node; and wherein said driver circuit activates said first and second current devices to apply said first drive level, and actives only one of said first and second current devices to apply said second drive level.

6. The segmented driver of claim 1, further comprising:
a threshold pin; and
a current source configured to provide a threshold current to said threshold pin to develop said threshold voltage.

7. The segmented driver of claim 1, wherein said controller is further configured to command said driver circuit to re-apply said first drive level after a predetermined period of time.

8. The segmented driver of claim 1, further comprising a sense circuit that is configured to enable said comparator to detect a fault condition in response to an on indication, and wherein said sense circuit is reconfigured to enable said comparator to more quickly detect when said voltage of said sense terminal reaches said threshold voltage in response to said off indication.

9. The segmented driver of claim 1, further comprising:
a thermal sensor for sensing temperature and for providing a temperature indication indicative thereof; and
a voltage threshold component that is configured to adjust said threshold voltage based on said temperature indication.

10. A bridge system, comprising:
a transistor device having first and second current terminals coupled between a power link and a phase node, and having a control terminal;
a turn off driver coupled to said control terminal of said transistor device;
a comparator that is configured to compare a voltage of said first current terminal of said transistor device with a threshold voltage and to provide a threshold indication when said voltage of said first current terminal reaches said threshold voltage; and
a drive controller that is configured to activate said turn off driver at a first drive level to begin turning off said transistor device in response to an off indication, and to activate said turn off driver at a second drive level which is less than said first drive level in response to said threshold indication.

11. The bridge system of claim 10, wherein said drive controller is further configured to re-activate said turn off driver at said first drive level after a predetermined time period.

12. The bridge system of claim 10, further comprising:
a resistor having a first end coupled to said control terminal of said transistor device and having a second end; and wherein said turn off driver comprises:
a first current device coupled between said second end of said resistor and a reference node; and
a second current device coupled between said control terminal of said transistor device and said reference node.

13. The bridge system of claim 12, wherein said drive controller is configured to activate said first and second current devices to begin turning off said transistor device at said first drive level, and to de-activate said second current device while said first current device remains activated in response to said threshold indication to complete turning off said transistor device at said second drive level.

14. The bridge system of claim 10, wherein said transistor device comprises an insulated-gate bipolar transistor.

15. The bridge system of claim 10, further comprising:
a thermal sensor for sensing and for providing a temperature indication indicative thereof; and
a voltage threshold device that is configured to adjust said threshold voltage based on said temperature indication.

16. A method of segmenting drive operation, comprising:
applying a first drive level between at least one driver node and a reference node to begin a turn off operation;
comparing a voltage of a sense node with a threshold voltage and providing a threshold indication when the voltage of the sense terminal reaches the threshold voltage; and
applying a second drive level that is less than the first drive level in response to the threshold indication to complete the turn off operation.

17. The method of claim 16, further comprising increasing the drive level back to the first drive level after the turn off operation is completed.

18. The method of claim 16, wherein said applying a first drive level comprises activating a number of current devices, and wherein said applying a second drive level comprises reducing the number of current devices that are activated.

19. The method of claim 16, wherein said applying a first drive level comprises activating a first current device coupled to a first driver node and activating a second current device coupled to a second driver node, and wherein said applying a second drive level comprises de-activating the second current device.

20. The method of claim 16, further comprising:
monitoring temperature and providing a temperature indication; and
adjusting the threshold voltage based on the temperature indication.

* * * * *